(12) United States Patent
Denes

(10) Patent No.: US 9,712,086 B2
(45) Date of Patent: Jul. 18, 2017

(54) SURFACES THAT EASE RELATIVE DISPLACEMENT IN EAP GENERATORS

(75) Inventor: Istvan Denes, Waiblinge (DE)

(73) Assignee: Robert Bosch GmbH, Stuttgart (DE)

( * ) Notice: Subject to any disclaimer, the term of this patent is extended or adjusted under 35 U.S.C. 154(b) by 536 days.

(21) Appl. No.: 14/126,263

(22) PCT Filed: Apr. 19, 2012

(86) PCT No.: PCT/EP2012/057102
§ 371 (c)(1),
(2), (4) Date: Mar. 14, 2014

(87) PCT Pub. No.: WO2012/171681
PCT Pub. Date: Dec. 20, 2012

(65) Prior Publication Data
US 2014/0191615 A1    Jul. 10, 2014

(30) Foreign Application Priority Data

Jun. 16, 2011 (DE) .................. 10 2011 077 583

(51) Int. Cl.
*H02N 1/08* (2006.01)
*H01L 41/053* (2006.01)
(Continued)

(52) U.S. Cl.
CPC .............. *H02N 1/08* (2013.01); *H01L 41/053* (2013.01); *H01L 41/113* (2013.01); *H02N 2/18* (2013.01);
(Continued)

(58) Field of Classification Search
CPC .......... H02N 1/00; H02N 1/002; H02N 1/004; H02N 1/006; H02N 1/008; H02N 1/04;
(Continued)

(56) References Cited

U.S. PATENT DOCUMENTS 7,034,432 B1 * 4/2006 Pelrine .................. F02G 1/043
310/309
7,224,106 B2 * 5/2007 Pei .......................... F02G 1/043
310/311
(Continued)

FOREIGN PATENT DOCUMENTS

DE   10 2009 035 928   12/2010
WO   WO 2010/011562    1/2010
WO   WO 2010/111376    9/2010

OTHER PUBLICATIONS

EIC 2800 STIC Search Report case 14126263 by Benjamin Martin, Nov. 25, 2015,501301.*

(Continued)

*Primary Examiner* — Michael Andrews
*Assistant Examiner* — Maged Almawri
(74) *Attorney, Agent, or Firm* — Norton Rose Fulbright US LLP; Gerald Messina

(57) ABSTRACT

An EAP generator is described, including at least one EAP stack that is disposed between two force-transferring surfaces disposed parallel to one another, having at least one layer, facilitating relative displacement between the end of the EAP stack and the force-transferring surface facing toward that end, in particular a deformable or friction-reducing intermediate layer. A corresponding method for generating electrical energy from elongation energy on a capacitive basis by charge displacement is also described.

27 Claims, 3 Drawing Sheets

(51) Int. Cl.
  *H01L 41/113* (2006.01)
  *H02N 2/18* (2006.01)
  *H02N 1/00* (2006.01)
  *H02N 1/04* (2006.01)
(52) U.S. Cl.
  CPC ............... *H02N 1/00* (2013.01); *H02N 1/002* (2013.01); *H02N 1/004* (2013.01); *H02N 1/04* (2013.01)
(58) Field of Classification Search
  CPC ... H02N 1/08; H02N 1/10; H02N 1/18; H01L 41/053; H01L 41/113; H01L 41/1138
  USPC .................................................. 310/309, 310
  See application file for complete search history.

(56) References Cited

U.S. PATENT DOCUMENTS

| | | | | |
|---|---|---|---|---|
| 7,608,989 | B2* | 10/2009 | Heydt | H04R 19/02 310/317 |
| 2001/0032663 | A1* | 10/2001 | Pelrine | F02G 1/043 136/205 |
| 2008/0034873 | A1* | 2/2008 | Habu | H01L 41/257 73/632 |
| 2010/0079037 | A1 | 4/2010 | Jean-Mistral et al. | |
| 2010/0171393 | A1* | 7/2010 | Pei | H01L 41/094 310/330 |
| 2011/0001398 | A1* | 1/2011 | Kang | H01L 41/0478 310/363 |
| 2011/0200848 | A1* | 8/2011 | Chiang | B60L 11/1875 429/4 |
| 2011/0215580 | A1* | 9/2011 | Lu | F03B 13/14 290/53 |
| 2011/0300393 | A1* | 12/2011 | Iio | C08K 3/36 428/521 |
| 2012/0274178 | A1* | 11/2012 | Ochi | H01L 41/29 310/311 |
| 2013/0307371 | A1* | 11/2013 | Sakashita | H01L 41/113 310/300 |

OTHER PUBLICATIONS

International Search Report, PCT International Application No. PCT/EP2012/057102, dated Sep. 25, 2012.

* cited by examiner

SURFACES THAT EASE RELATIVE DISPLACEMENT IN EAP GENERATORS

BACKGROUND INFORMATION

The generation of energy from waves is the conversion of the motion energy of waves at the ocean surface into, for example, electrical energy. To allow utilization of the energy of ocean waves, the kinetic energy can be converted into a linear motion with the aid of the relative deflection of floats. One example is the "sea serpent" (Greek "pelamis") configuration for wave power converters. These are made up of multiple tubular steel segments movably connected to one another via joints. Hydraulic pumps are mounted at the joints and drive a generator. Another example is so-called point absorbers. These are floating apparatuses having components that move relative to one another as a result of wave motion, for example a floating buoy inside a stationary cylinder. The relative motion of the components is used to operate electromechanical or hydraulic energy converters.

An energy conversion device for converting wave energy is described, for example, in German Patent Application No. DE 10 2009 035 928 A1. This conversion device has at least one coupling element, disposed in a fluid, which is set up to couple to at least one orbital flow motion associated with the wave motion of the fluid. The conversion device further has a guidance device that defines a guided, endlessly circulating orbital motion and/or rotary motion of the at least one coupling element. The guidance device has a drive system at which it converts the circulating motion and/or rotary motion into a torque.

Electroactive polymers (EAPs) are polymers that change shape as a result of the application of an electrical voltage.

Electroactive polymers are therefore used as actuators or sensors. Electroactive polymers also make possible a generator mode, however, in which mechanical elongation energy is converted directly into electrical energy. Energy converters of this kind are referred to as "EAP generators." Conversion of the elongation energy into electrical energy occurs on a capacitive basis as a result of charge displacement. In the context of energy recovery using EAPs, the EAP generator, encompassing at least one component that encompasses two resilient electrodes between which is disposed a layer of electroactive polymer, is elongated as a result of an externally applied force. When the EAP generator is in the state of maximum elongation, the assemblage is impinged upon by electrical charges below the breakdown field strength. As the externally applied force decreases, the EAP relaxes because of the elastic effect of the polymer. The energy stored in the EAP generator increases in this phase. This operation represents the actual conversion of mechanical energy into electrical energy. As soon as the EAP generator is completely relaxed, the assemblage is discharged, with the result that the EAP returns to its original length. The energy recovery cycle can begin again.

For EAP generators, multiple plies, each encompassing two electrodes between which a layer of an electroactive polymer is disposed, can be combined into an EAP stack. For the present invention, however, the term "EAP stack" is also understood as embodiments that have only one ply made up of two electrodes having between them a layer of electroactive polymer. "EAP stacks" for purposes of the present invention are therefore stacks that have at least one ply encompassing two preferably flexible electrodes and a layer of electroactive polymer disposed between the two electrodes. For EAP generators, the EAP stack or multiple EAP stacks are disposed between two force-transferring surfaces disposed parallel to one another, preferably in such a way that the plies of the EAP stack are disposed parallel to the force-transferring surfaces. As soon as a force is exerted via these surfaces onto an EAP stack, the stack becomes compressed in a vertical direction, i.e., in the direction perpendicular to the force-transferring surface, but at the same time it elongates in a horizontal direction, i.e., in the plane of the plies of the EAP stack, relative to the EAP plies. The horizontal elongation of an EAP stack is impeded at both of its ends by the frictional forces between the end surfaces of the EAP stack and the force-transferring surfaces. This results in bulging of the EAP stack and, associated therewith, non-optimal energy conversion.

SUMMARY

The present invention relates to EAP generators including at least one EAP stack that is disposed between two force-transferring surfaces disposed parallel to one another, the EAP generator having at least one layer, facilitating relative displacement between the one end of the at least one EAP stack and the force-transferring surface facing toward that end, between that end of the at least one EAP stack and the force-transferring surface facing toward that end. The term "relative displacement" refers to the relative displacement that takes place between the at least one EAP stack and the force-transferring surface, namely between the one end of the at least one EAP stack and the force-transferring surface that faces toward that end.

In an example embodiment, the layer facilitating relative displacement between the at least one EAP stack and the force-transferring surface is a friction-reducing layer. The term "friction-reducing" refers to the friction that exists, upon transfer of a force onto the EAP stack, between the one end of the EAP stack and the force-transferring surface facing toward that end if the end of the EAP stack and the force-transferring surface facing toward that end were in direct contact with one another. The friction-reducing layer is preferably made of a different material than the force-transferring surface and the end of the EAP stack between which the friction-reducing layer is disposed, and/or has different surface properties. The friction-reducing layer can be a liquid or can be made of a solid material. The friction-reducing layer can be selected from the group that contains liquid lubricants, for example lubricating oils, lubricating greases, and solid lubricants.

If the friction-reducing layer is made of a solid material, the EAP generator can additionally have a liquid lubricant, for example a lubricating oil, on the surface of the friction-reducing layer, for example between the at least one EAP stack and at least one of the force-transferring surfaces. The thickness of the liquid lubricant layer between an EAP stack and the force-transferring surface depends greatly on the normal forces that act on the mutually oppositely located surfaces of the EAP stack and of the force-transferring surface. If the force that is transferred from the force-transferring surface onto the EAP stack increases above a specific value, the liquid can be pressed out of the gap between the EAP stack and the force-transferring surface. That would result in dry friction between the two surfaces. To prevent dry friction from occurring between these surfaces, the surface of the friction-reducing layer can be structured, if said layer is a solid element.

The friction-reducing layer can have, as a structuring of its surface, depressions or chambers that are in communication with the surface. These chambers may contain the lubricant. As a result of the communication between the chambers and the surface of the friction-preventing layer, the hydrostatic pressure in the chambers and between the surfaces is the same. During elongation of the EAP surface, a relative displacement takes place between the friction-reducing layer and the force-transferring surface. The chambers make available the lubricant for the gap between the two surfaces, provided the volume of the chambers has not completely disappeared as a result of the deformation of the friction-reducing layer caused by the transferred forces.

In another embodiment, the EAP generator according to the present invention has a so-called intermediate layer as a layer facilitating relative displacement. The intermediate layer is highly deformable. It deforms when force is transferred onto the EAP stack and it elongates. Because of the great deformability of the intermediate layer, the restricting forces, together with bulging of the EAP stack, can be decreased.

The material from which the intermediate layer is made can be homogeneous and can have intrinsic properties that enable the great deformability. The intermediate layer can also be present in the form of a foamed material, however, the cavities contained in the foamed material substantially making possible the deformability of the intermediate layer. At the end of the phase in which the surface impinged upon by the transferred force elongates, the intermediate layer has a substantially trapezoidal shape. In this phase it is in contact both with the force-transferring surface and with the surface that faces toward that end of the EAP stack.

According to an example embodiment, the EAP generator has a layer facilitating relative displacement only at one end of the at least one EAP stack, between the end of the EAP stack and the force-transferring surface facing toward that end. In a preferred embodiment, the EAP generator according to the present invention has a layer facilitating relative displacement at each of the two ends of the or of each EAP stack, between the end of the EAP stack and the force-transferring surface facing toward that end.

The layer facilitating relative motion can be disposed or mounted on the surface of the end of an EAP stack. The layer facilitating relative displacement can also be disposed or mounted on the force-transferring surface, preferably only in the region of that surface which is located directly below and/or directly above an EAP stack.

The EAP generators according to the present invention allow undesired deformations of the EAP stack to be avoided, thereby making possible more efficient energy conversion into electrical energy. At the same time, the mechanical stress on the EAP is decreased, thereby also extending its service life.

The present invention also extends to the use of the EAP generators according to the present invention for the generation of electrical energy. The present invention therefore also includes an example method for generating electrical energy from elongation energy on a capacitive basis by charge displacement, in which the EAP stack of an EAP generator encompassing at least one EAP stack is disposed between two force-transferring surfaces disposed parallel to one another, the EAP generator having at least one layer, facilitating relative displacement between the one end of the at least one EAP stack and the force-transferring surface facing toward that end, between that end of the at least one EAP stack and the force-transferring surface facing toward that end, by the fact that a layer of electroactive polymer is elongated as a result of an externally applied force, is impinged upon in the state of maximum elongation by electric charges below the breakdown field strength, the electroactive polymer relaxes, and the charge is picked off upon complete relaxation of the layer.

The present invention will be explained below in more detail with references to the illustrations and to concrete exemplifying embodiments. It is to be kept in mind here that neither the figures nor the concrete exemplifying embodiments used for explanation are to be regarded as limiting the present invention thereto.

DETAILED DESCRIPTION OF EXAMPLE EMBODIMENTS

Figure 1A:
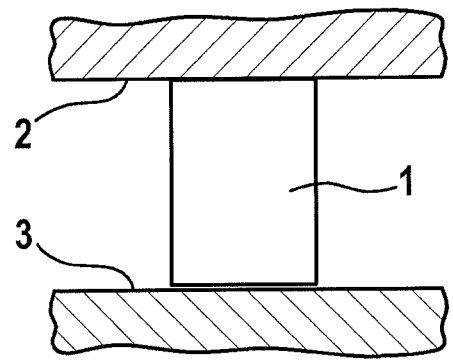
FIGS. 1a and 1b illustrate a problem on which the present invention is based.
Figure 1B:
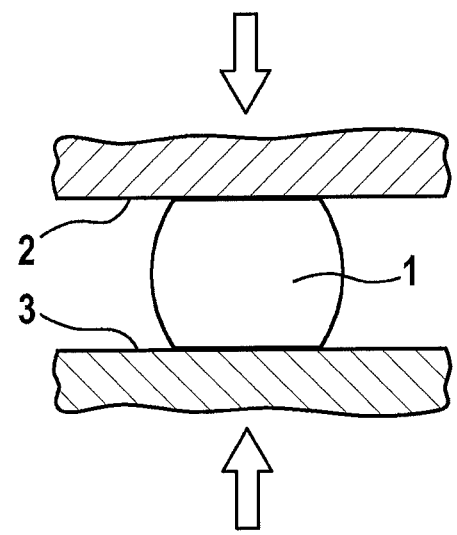

FIGS. 1a and 1b illustrate a problem on which the present invention is based. An EAP stack 1 is disposed between a first force-transferring surface 2 and a second force-transferring surface 3 that is disposed parallel to the first force-transferring surface 2. FIG. 1a shows EAP stack 1 in a relaxed state, i.e., in a state in which no forces are being transferred from force-transferring forces 2, 3 onto EAP stack 1. FIG. 1b shows the assemblage depicted in FIG. 1a, force-transferring surfaces 2, 3, having been brought closer to one another so that force is transferred onto EAP stack 1 located therebetween. The EAP stack becomes deformed as a consequence thereof. It bulges out because it cannot elongate uniformly over its entire height as a result of the friction between its surfaces facing toward the force-transferring surfaces and the force-transferring surfaces.

Figure 2A:
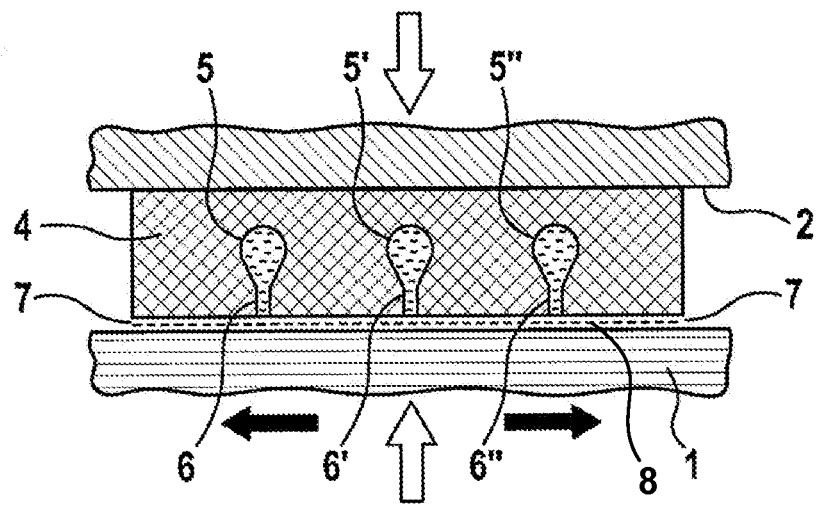
FIGS. 2a and 2b show an example embodiment of the present invention.
Figure 2B:
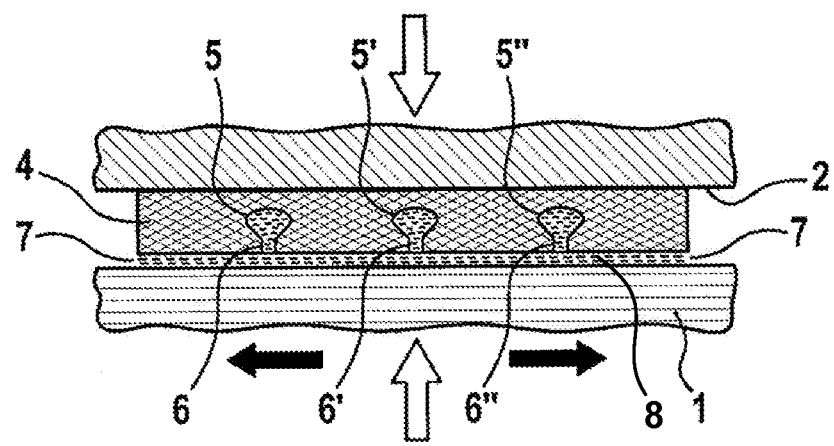

FIGS. 2a and 2b show an example embodiment of the present invention in which a friction-reducing layer 4 is disposed between force-transferring surface 2 and EAP stack 1. Friction-reducing layer 4 is mounted on surface 2. Friction-reducing layer 4 has chambers 5, 5', and 5", each of chambers 5, 5', and 5" being in communication via a conduit 6, 6', 6" with the surface of layer 4 and thus with gap 7. Chambers 5, 5', and 5", and gap 7 between friction-reducing layer 4 and EAP stack 1, are filled with a lubricant 8.

FIG. 2a shows EAP stack 1 in a relaxed state, i.e., in a state in which no forces are being transferred from force-transferring surface 2 onto EAP stack 1. FIG. 2b shows the assemblage depicted in FIG. 2a in a state in which force is being transferred from surface 2 onto EAP stack 1. Friction-reducing layer 4 thereby becomes deformed, and lubricant 8 is pushed through conduits 6 out of the compressed chambers 5, 5', and 5" into gap 7.

Figure 3A:
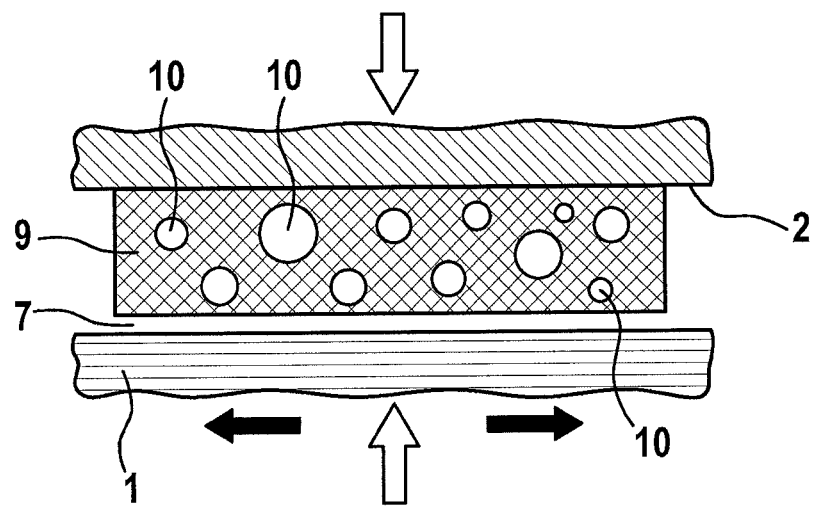
FIGS. 3a and 3b shown an additional example embodiment of present invention.
Figure 3B:
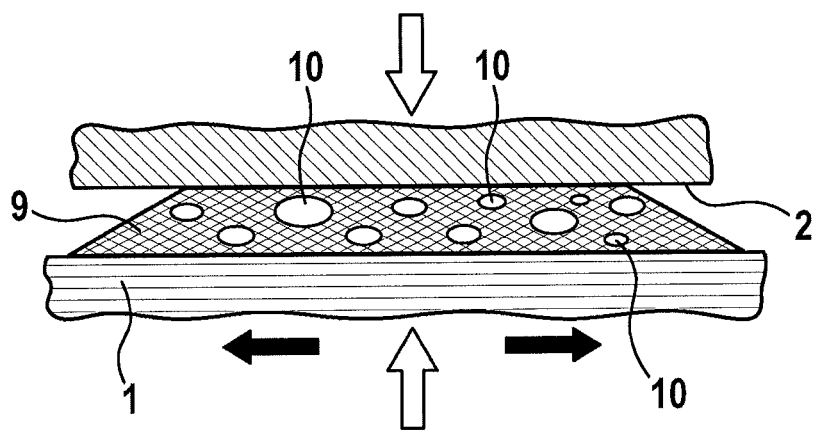

FIGS. 3a and 3b show an alternative example embodiment in which a deformable intermediate layer 9 is disposed between force-transferring surface 2 and EAP stack 1. Intermediate layer 9 is mounted on force-transferring surface 2. Intermediate layer 9 has compressible cavities 10.

FIG. 3a shows EAP stack 1 in a relaxed state, i.e., in a state in which no forces are being transferred from force-transferring surface 2 onto EAP stack 1. FIG. 3b shows the assemblage depicted in FIG. 3a in a state in which force is being transferred from surface 2 onto stack 1. Intermediate layer 9 thereby becomes compressed. Cavities 10 become deformed, and intermediate layer 9 assumes a trapezoidal

What is claimed is:

1. An electroactive polymer (EAP) generator, comprising: at least one EAP stack disposed between two force-transferring surfaces disposed parallel to one another, the force transferring surfaces configured to receive forces and transfer the received forces to the at least one EAP stack to generate energy in the at least one EAP stack; and at least one layer that facilitates relative displacement between one end of the at least one EAP stack and one of the force-transferring surfaces that faces toward the one end, the at least one layer being disposed between the one end of the at least one EAP stack and the force-transferring surface that faces toward the one end, the relative displacement including movement of the one end of the at east one EAP stack relative to the one of the force-transferring surfaces in a direction substantially parallel to the one of the force-transferring surfaces, wherein the at least one layer that facilitates relative displacement has a structure including a plurality of chambers located internally to the at least one layer that facilitates relative displacement, and a plurality of conduits connecting the plurality of chambers to a surface of the at least one layer that facilitates relative displacement facing the at least one EAP stack.

2. The EAP generator as recited in claim 1, wherein the EAP generator has a layer facilitating relative displacement only at one end of the at least one EAP stack.

3. The EAP generator as recited in claim 1, wherein the EAP generator has a layer facilitating relative displacement at each of two ends of the at least one EAP stack.

4. The EAP generator as recited in claim 1, wherein the layer facilitating relative motion is disposed on a surface of the end of an EAP stack.

5. The EAP generator as recited in claim 1, wherein the layer facilitating relative movement is disposed on the force-transmitting surface at least one of directly below an EAP stack and directly above an EAP stack.

6. The EAP generator as recited in claim 1, wherein the at least one layer facilitating relative displacement is separate from the at least one EAP stack and the force-transferring surfaces, the at least one EAP stack including an EAP layer and a pair of electrodes.

7. The EAP generator as recited in claim 1, further comprising a liquid lubricant on the surface of the at least one layer that facilitates relative displacement facing the at least one EAP stack and in the plurality of chambers of the friction-reducing layer.

8. The EAP generator as recited in claim 1, wherein the at least one EAP stack includes an EAP layer and a pair of electrodes.

9. The EAP generator as recited in claim 8, wherein the force-transferring surfaces are distinct from the at least one EAP stack.

10. The EAP generator as recited in claim 1, wherein the at least one layer facilitating relative displacement includes an intermediate layer, the intermediate layer deforming to allow the movement of the one end of the at least one EAP stack relative to the one of the force-transferring surfaces.

11. The EAP generator as recited in claim 10, wherein the intermediate layer is made of a homogeneous material whose intrinsic properties enable deformability.

12. The EAP generator as recited in claim 10, wherein the intermediate layer is made of a foamed material.

13. The EAP generator as recited in claim 10, wherein deforming of the intermediate layer increases a dimension of the intermediate layer at one end of the intermediate layer facing the at least one EAP stack.

14. The EAP generator as recited in claim 10, wherein the deforming of the intermediate layer results in a cross section of the intermediate layer having a trapezoidal shape.

15. The EAP generator as recited in claim 1, wherein the layer that facilitates relative displacement is a friction-reducing layer.

16. The EAP generator as recited in claim 15, wherein the friction-reducing layer is made of a solid.

17. The EAP generator as recited in claim 16, further comprising: a liquid lubricant on the surface of the friction-reducing layer.

18. A method for generating electrical energy from elongation energy on a capacitive basis by charge displacement, comprising: providing an electroactive polymer (EAP) generator including at least one EAP stack that is disposed between two force-transferring surfaces disposed parallel to one another, the force transferring surfaces configured to receive forces and transfer the received forces to the at least one EAP stack to generate energy in the at least one EAP stack, the EAP generator having at least one layer facilitating relative displacement between one end of the at least one EAP stack and one of the force-transferring surfaces that faces toward the one end, the at least one layer being disposed between the one end of the at least one EAP stack and the force-transferring surface that faces toward the one end, the relative displacement including movement of the one end of the at least one EAP stack relative to the one of the force-transferring surfaces in a direction substantially parallel to the one of the force-transferring surfaces, wherein the at least one layer that facilitates relative displacement has a structure including plurality of chambers located internally to the at least one layer that facilitates relative displacement, and a plurality of Conduits connecting the plurality of chambers to a surface of the at least one layer that facilitates relative displacement facing the at least one EAP stack; and elongating a layer of electroactive polymer of the EAP stack as a result of an externally applied force.

19. The method as recited in claim 18, wherein the at least one layer facilitating relative displacement includes a friction-reducing layer made of a solid.

20. The method as recited in claim 18, wherein the EAP generator includes a liquid lubricant on the surface of the at least one layer that facilitates relative displacement facing the at least one EAP stack and in the plurality of chambers of the friction-reducing layer.

21. The method as recited in claim 18, wherein the at least one layer facilitating relative displacement is distinct from the at least one EAP stack and the force-transferring surfaces, the at least one EAP stack including an EAP layer and a pair of electrodes.

22. The method as recited in claim 18, further comprising:
impinging the layer of electroactive polymer in a state of maximum elongation with electric charges below the breakdown field strength;
relaxing by the electroactive polymer; and
picking off a charge upon complete relaxation of the electroactive polymer layer.

23. The method as recited in claim 18, wherein the at least one EAP stack includes an EAP layer and a pair of electrodes.

24. The method as recited in claim 23, wherein the force-transferring surfaces are distinct from the at least one EAP stack.

25. The method as recited in claim 18, wherein the at least one layer facilitating relative displacement includes an intermediate layer, the intermediate layer deforming to allow the movement of the one end of the at least one EAP stack relative to the one of the force-transferring surfaces.

26. The method as recited in claim 25, wherein the deforming of the intermediate layer increases a dimension of the intermediate layer at one end of the intermediate layer facing the at least one EAP stack.

27. The method as recited in claim 25, wherein the deforming of the intermediate layer results in a cross section of the intermediate layer having a trapezoidal shape.

\* \* \* \* \*